United States Patent [19]

Sakai

[11] Patent Number: 4,876,957
[45] Date of Patent: Oct. 31, 1989

[54] APPARATUS FOR APPLYING AN EMULSION SCREEN FILM OF SCREEN-PRINTING

[75] Inventor: Shigekazu Sakai, Gifu, Japan

[73] Assignees: Tokai Shoji Co., Ltd., Tokyo; Tokai Seiki Co., Ltd., Gifu, both of Japan

[21] Appl. No.: 96,975

[22] Filed: Sep. 14, 1987

[30] Foreign Application Priority Data

Oct. 31, 1986 [JP] Japan .......................... 61-167877[U]

[51] Int. Cl.⁴ .............................................. B41C 1/14
[52] U.S. Cl. .................................. 101/128.4; 101/129
[58] Field of Search ............ 101/125, 126, 127, 127.1, 101/128.4, 128.21, 129, 123, 121

[56] References Cited

U.S. PATENT DOCUMENTS

| | | | |
|---|---|---|---|
| 2,562,676 | 7/1951 | Morton et al. ................. | 101/128.21 |
| 3,865,154 | 2/1975 | Cox et al. ..................... | 101/128.4 X |
| 4,319,253 | 3/1982 | Heyer et al. ................. | 101/128.4 X |
| 4,363,289 | 12/1982 | Gasser .......................... | 101/128.4 X |
| 4,628,813 | 12/1986 | Hasegawa et al. .......... | 101/128.4 X |

FOREIGN PATENT DOCUMENTS

| | | | |
|---|---|---|---|
| 2253907 | 6/1973 | Fed. Rep. of Germany ... | 101/128.4 |
| 16788 | 1/1984 | Japan ............................. | 101/128.21 |
| 188185 | 11/1984 | Japan ............................. | 101/128.4 |
| 2169555 | 7/1986 | United Kingdom ............ | 101/128.4 |

Primary Examiner—William Pieprz
Assistant Examiner—James R. McDaniel
Attorney, Agent, or Firm—Helfgott & Karas

[57] ABSTRACT

An apparatus for applying an emulsion screen film of screen-printing is disclosed, which includes a support frame for vertically supporting a screen-printing plate and for holding a rolled emulsion screen film above the screen-printing plate, a film guiding- and cutting-mechanism for guiding and positioning the unrolled emulsion screen film in contact with a screen surface of the screen-printing plate from its upper portion and for cutting the film at a predetermined length, and a pressing- and applying-mechanism for pressing the emulsion screen film against the screen surface at its lower portion and for supplying an emulsion onto an opposite side of the screen surface relative to the contacted screen side while sliding upwardly in contact with the screen surface.

11 Claims, 6 Drawing Sheets

FIG. 2
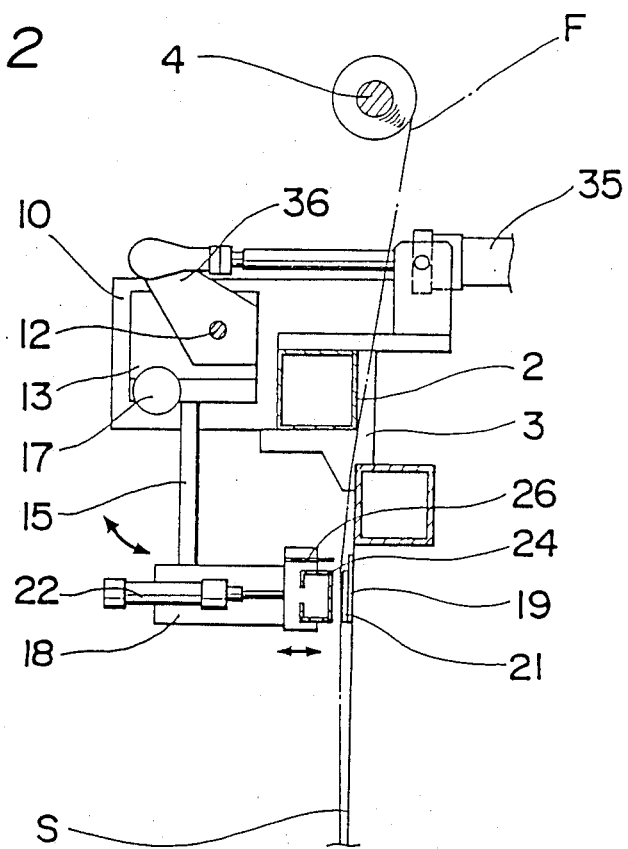
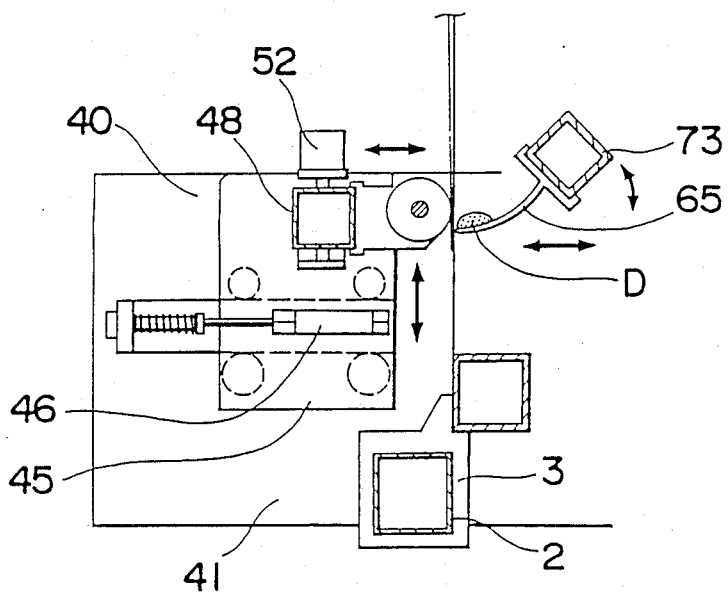

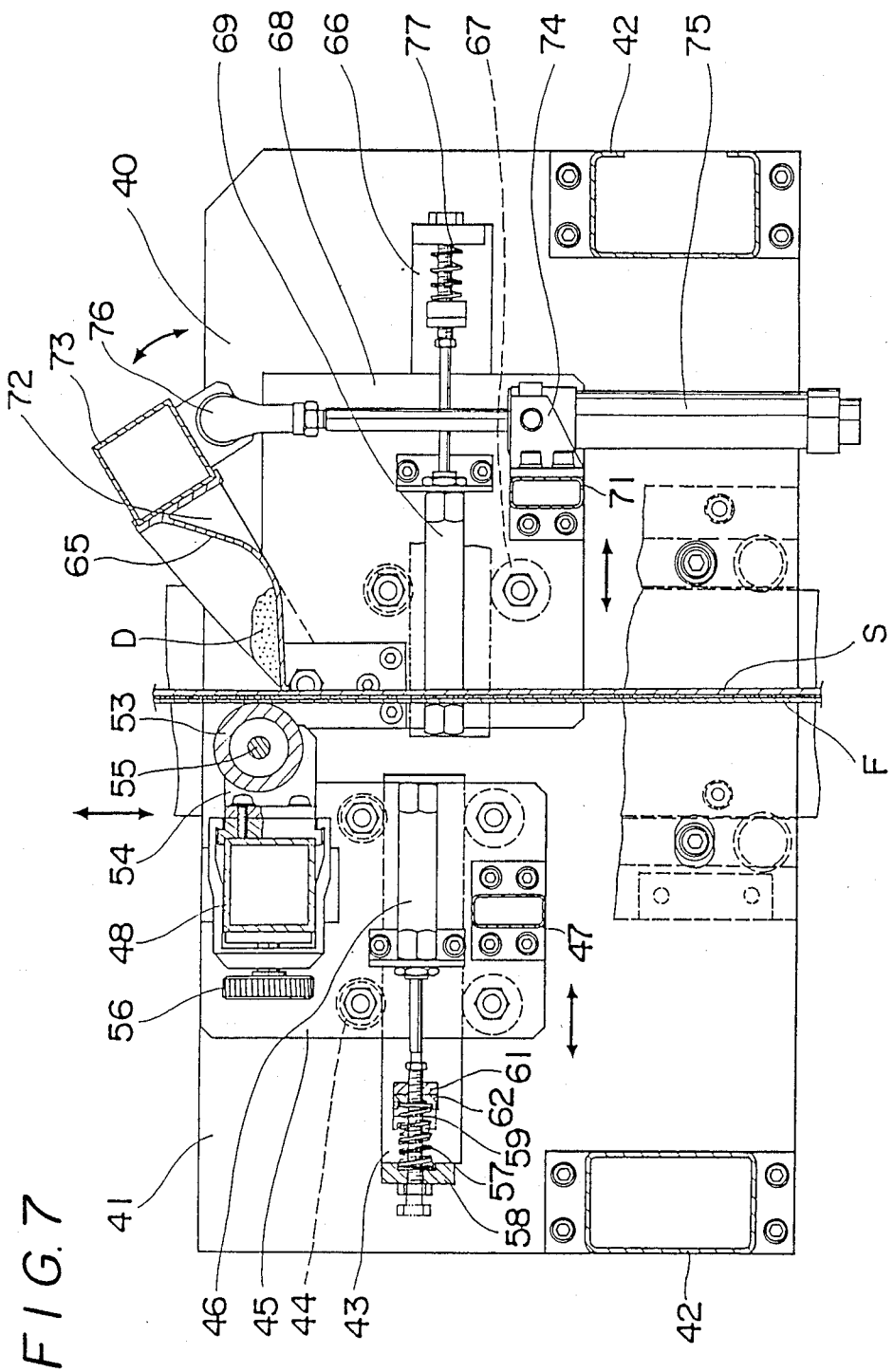

APPARATUS FOR APPLYING AN EMULSION SCREEN FILM OF SCREEN-PRINTING

FIELD OF THE INVENTION

This invention relates to an apparatus for applying an emulsion screen film of screen-printing in order to set the emulsion film on a printing-screen.

BACKGROUND OF THE INVENTION

In order to apply a photosensitive emulsion onto a printing screen, an emulsion bucket is slidably contacted with a surface of the screen which is vertically set, thereby applying the emulsion thereon.

An automatic emulsion-applying means of such type is described in Japanese Patent Publication 58-53332 and its improvement is disclosed in Japanese Laid-open Application 59-171958 belonging to the present applicant. Since a viscous emulsion is applied onto a mesh screen of a printing-plate in either one of these systems, the applying procedure must be repeated in several times for providing a suitable thickness of an emulsion film. Further, a viscosity and amount of the emulsion as well as an applying pressure of the emulsion bucket to the screen must be adjusted to achieve the correct thickness of the emulsion film, resulting in a troublesome operation.

For the improvement, the applicant has proposed apparatus in, for example, Japanese Laid-open Application 60-188949 and Japanese Laid-open Application 61-113063 for applying the emulsion of a pedetermined thickness onto the screen by use of an emulsion screen film which has previously formed as an emulsion film of the same thickness.

One of such proposed systems is shown in FIG. 8 wherein a vertically supported printing-screen S is provided securely with an emulsion screen film F of a predetermined size by means of an adhesive tape and wherein the printing-screen is pressed by an emulsion bucket B on the side of the emulsion screen film F while the opposite side is supplied with an emulsion D. Another proposed system is shown in FIGS. 9 and 10 wherein a back board R with a rubber or flexible foamed resin is arranged behind the printing-screen S and wherein the opposite side is supplied with the emulsion D by the emulsion bucket B. In this manner, the emulsion bucket B containing the emulsion D is slidingly contacted to the opposite side of the printing-screen S provided with the emulsion screen film F for wetting the emulsion layer of the screen film F, thereby securely applying the emulsion film onto the screen. These methods utilize the emulsion screen film F, which has previously been formed into the membrane of the predetermined thickness, so that the printing-screen S having the emulsion film of an accurate thickness may be prepared.

As described hereinabove, the use of such emulsion screen film F is very effective but requires additional steps of positioning the emulsion film accurately on the screen surface, securely applying the film thereto, cutting the film in a required length and others.

In order to support the emulsion screen film F of the required size on the screen surface, for example, an operator must support the film manually or the back board R must be provided behind the emulsion screen film F. These procedures are essentially manual and thus very troublesome. Further, incorrect support of the film cannot provide the advantage of utilizing the emulsion screen film F, such as the accurate thickness of the film.

According to the system of FIG. 8 in particular, even the pressure of the emulsion bucket on the emulsion screen film F against the printing-screen cannot readily be adjusted uniformly. According to the system as shown in FIGS. 9 and 10, on the other hand, a larger size of the emulsion bucket B than a size of the emulsion screen film F may pass the emulsion D through the screen on the either side of the emulsion screen film F, thereby contaminating the back board R with the emulsion. Thus, after the application the emulsion D must be removed from the back board R, resulting in a troublesome procedure.

Accordingly an object of the invention is to provide an automatic appartus for applying an emulsion screen film of screen-printing which enables the convenient and rapid operation of positioning the emulsion film accurately on the screen surface, securely applying the film thereto, cutting the film in a required length and others.

SUMMARY OF THE INVENTION

In order to achieve the above object, the invention provides an apparatus for applying an emulsion screen film of screen-printing, which comprises a support frame for vertically supporting a screen-printing plate and for holding a rolled emulsion screen film above the screen-printing plate, a film guiding- and cutting-mechanism for guiding and positioning the unrolled emulsion screen film in contact with a screen surface of the screen-printing plate from its upper portion and for cutting the film at a predetermined length, and a pressing- and applying-mechanism for pressing the emulsion screen film against the screen surface at its lower portion and for supplying an emulsion onto an opposite side of the screen surface relative to the contacted screen side while sliding upwardly in contact with the screen surface.

In the apparatus according to the invention, the printing-screen is vertically supported within the frame and thereafter the emulsion screen film is contacted from an upper side of the printing-screen down to its lower side.

At this point, the film guiding- and cutting-mechanism may guide and position the emulsion screen film from the upper side of the printing-screen and cut the same in a required length.

The emulsion screen film reaching the lower end of the printing-screen may be pressed by the pressing- and applying-mechanism which may upwardly slide along the screen surface for supplying the emulsion from the opposite side of its contacted surface. Upon the slide contact, the emulsion film may be moistened by the supplied emulsion and securely applied onto the screen.

For the better understanding, the invention will now be described in more detail with reference to the accompanying drawings.

BRIEF DESCRIPTION OF THE DRAWINGS

FIGS. 1 to 7 illustrate one embodiment of the invention in which:

FIG. 1 is a front view of the entire apparatus according to the invention;

FIG. 2 is a longitudinal sectioned side view;

FIG. 3 is a front view of an essential part of the film guiding- and cutting-mechanism;

FIG. 4 is a side view of a cutter portion of FIG. 3 showing its swinging- and retreating-movement;

FIG. 5 is a plan view of an essential part of the cutter portion;

FIG. 6 is a front view of an essential part of a pressing portion in the pressing- and applying-mechanism;

FIG. 7 is a side view of the pressing- and applying-mechanism showing its operation;

FIGS. 8 to 10 illustrate the conventional apparatus in which:

FIG. 8 is a schematic side view of the applying system utilizing emulsion buckets on either side of the screen;

FIG. 9 is a schematic side view of the applying system utilizing a back board and an emulsion bucket on one side; and FIG. 10 is a schematic front view thereof.

PREFERRED EMBODIMENTS OF THE INVENTION

Figure 1:
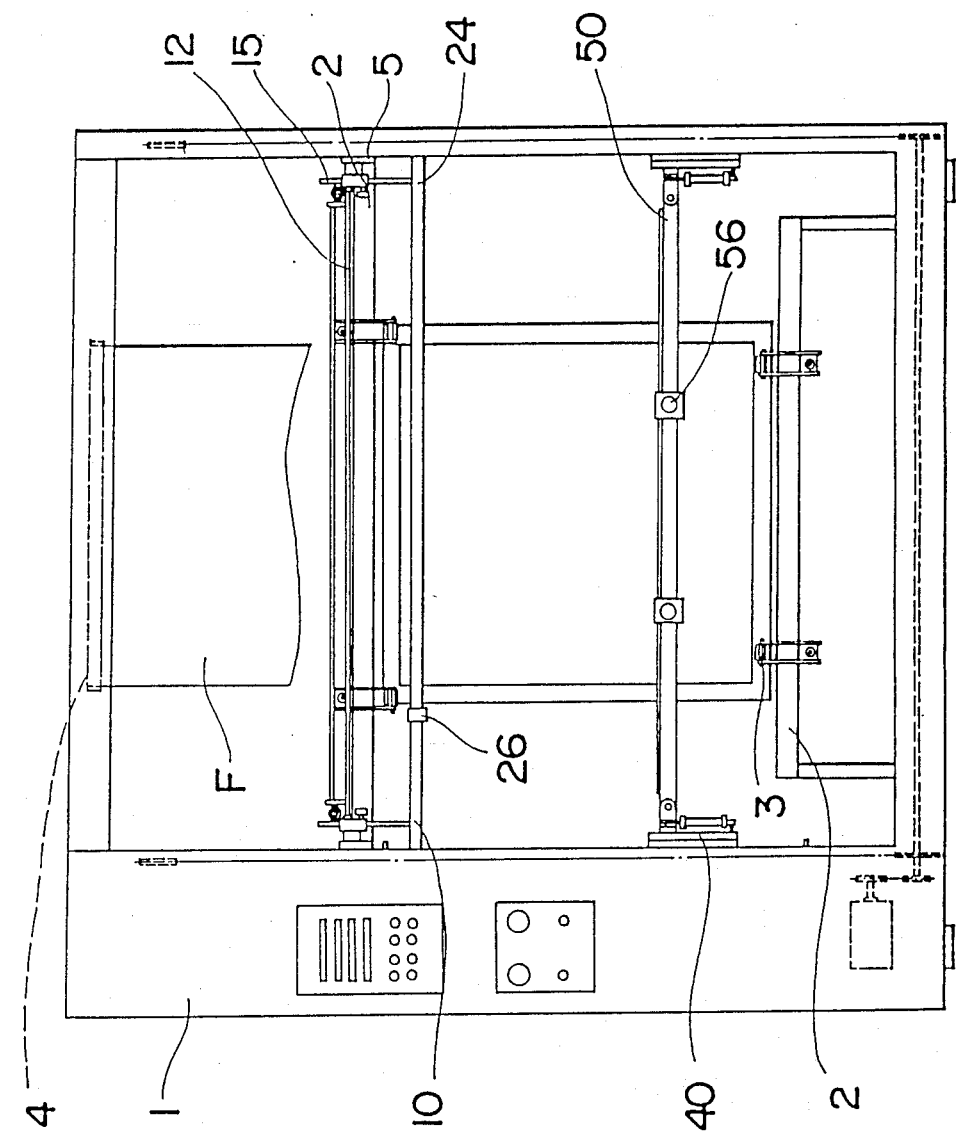

In the drawings, reference 1 represents a support frame in a rectangular form as seen from its front and is supported to a printing-screen S by lower and upper clamp bars 2 arranged between side walls of the frame. In other word, the frame of the printing-screen S is held by clamps 3 of the clamp bars 2 which are adjusted in their height depending on a size of the printing-screen S, thereby supporting the latter vertically within the frame 1. When supported as shown in FIG. 1, the frame at its front side is directed to a printing side of the screen S, on which an emulsion screen film F is applied.

In order to apply the emulsion screen film F onto the printing side of the printing-screen S, the emulsion screen film F in a roll form supported to an upper portion of the frame 1 is unrolled down to a lower portion of the printing-screen S. During their contacted state, an emulsion membrane of the emulsion screen film F is moistened with an emulsion D for achieving secure application and cutting the emulsion screen film F in a required length.

The emulsion screen film F is prepared by releasably stacking a wettable photosensitive emulsion film of a required thickness or of a plastic film form onto a film substrate of a plastic sheet. The required thickness of the film corresponds to a thickness to be applied onto the screen of the printing-screen S. The emulsion screen film F of the selected thickness is made in a roll form which is then rotatably supported to a support roll 4 at the upper portion of the frame 1 and on its emulsion film side is directed to a printing side of the screen for its withdrawal (unrolling).

The unrolled emulsion film F is then positioned and guided to the screen surface on an upper position of the printing-screen S, as shown in FIG. 2, and subsequently applied onto the screen by a film guiding- and cutting-mechanism 10 for cutting the film in the required length and by a pressing- and applying-mechanism for urging the emulsion screen film F against the screen at a lower position of the printing-screen S and sliding in the contacted state upwardly along the screen surface while supplying the emulsion D.

Figure 3:
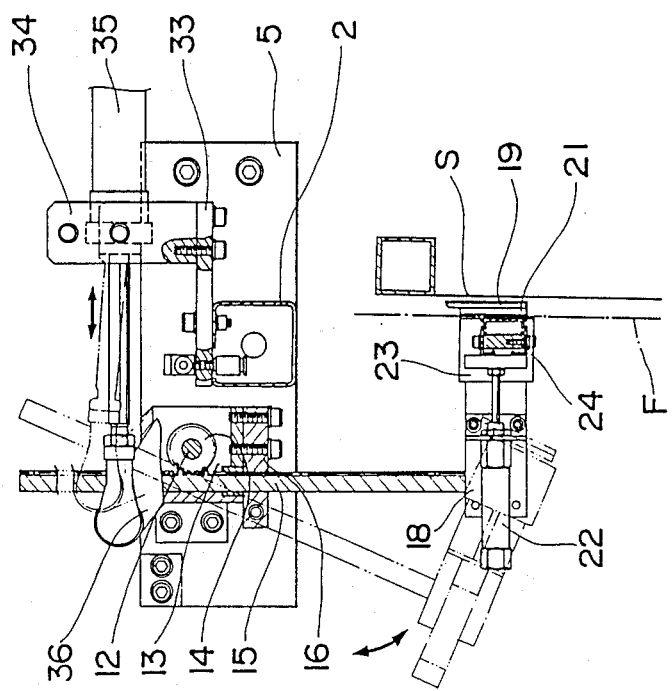
Figure 4:
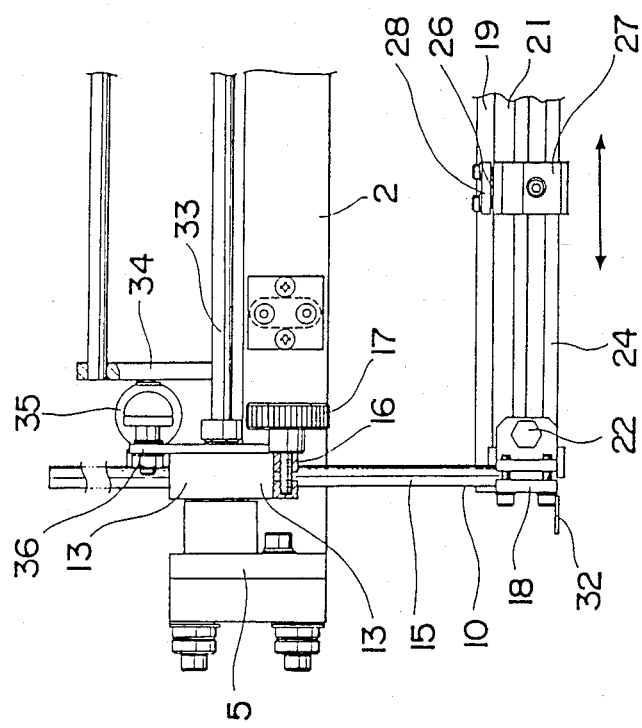
Figure 5:
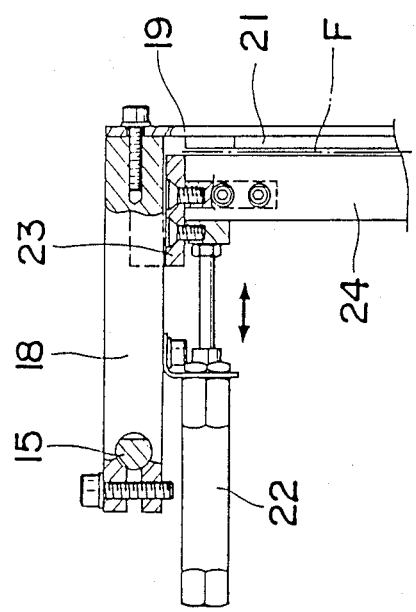
Figure 10:
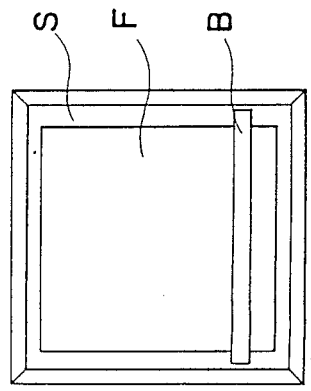
Figure 9:
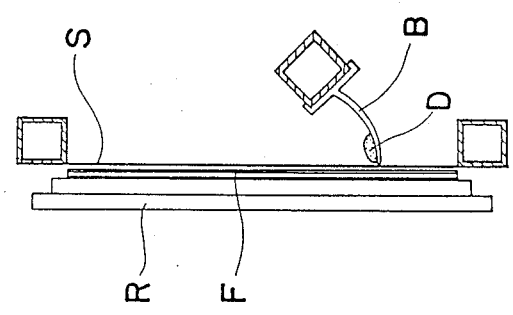
Figure 8:
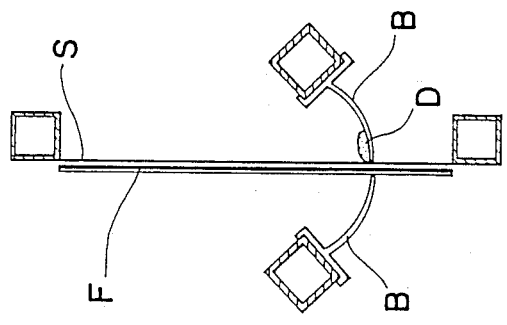

The film guiding- and cutting-mechanism 10 is provided with a vertically adjustable and swingable cutter 26 on counter-shaft brackets 11 arranged on the frame 1, as shown in FIGS. 3 to 5. The cutter 26 supports and cuts the unrolled emulsion screen film F contacted with the printing-screen S. The film guiding- and cutting-mechanism 10 is arranged between clamp bar side plates 5 vertically movable within the frame 1 in order to support the vertically movable clamp bar 2 depending on the size of the printing-screen S.

The clamp bar plates 5 are provided therebetween with a counter shaft bracket 11, on which a counter shaft is arranged as a bearing. The counter shaft 12 at its either end is provided with a gear box 13, through which a timing rack 15 is vertically passed in mesh with a pinion 14 fixed to the counter shaft 12 (see FIG. 4). The timing rack 15 at a lower end of the gear box 13 is surrounded by a lock plate 16 of a substantially C shape, into which is threaded a lock knob 17. By rotation of the lock 17 to fasten the lock plate 16, the timing rack 15 may be adjusted in its vertical height and fixed in position, while it may be also adjusted on both sides to set a balanced level.

The timing rack 15 at its lower end is fixed with a substantially horizontal rail support bar 18 which at its front end is located at the screen surface of the printing-screen S. Between the front ends of the right and left rail support bars 18 are arranged a cutter guide plate 19 and a cutter guide-on plate 21 which is set in a lower position than an upper edge of the cutter guide plate 19 (see FIG. 4). Further, the rail support bar 18 is secured with a pneumatic clamp cylinder 22 which at its top end is connected to one end of a cutter rail 24. The cutter rail 24 is arranged in parallel to the cutter guide plate 19 between rail side blocks 23 slidingly guided by the rail support bar 18. An air pressure applied on the clamp cylinder 22 may push forward the cutter rail 24, thereby holding the emulsion screen film F between the cutter rail 24 and the cutter guide-on plate 21 (see FIGS. 3 and 4). The cutter rail 24 and the cutter guide-on plate 21 on their inner faces are provided with a protective material (not shown), such as a rubber, for protecting the emulsion screen film F.

As shown in FIG. 3, the cutter rail 24 is provided with a cutter 26 which is movable along said rail. The cutter 26 is removably secured through a cutter clamp plate 28 on a cutter holder 27 which is slidably supported to the cutter rail 24 of a side-open channel shape. The cutter at its front end is located at the upper edge of the cutter guide-on plate 21. Thus, after the clamp cylinder 22 is operated to push forward the cutter rail 24 and to hold the emulsion screen film F, the cutter holder 27 is slided along the cutter rail 24 for cutting the emulsion screen film F. The cutter holder 27 may be operated manually or mechanically.

The procedure for cutting the emulsion film F by means of the cutter 26 is carried out after the emulsion film F has been pressed and supported at the lower position of the printing-screen S by a pressing- and applying-mechanism 40. When this mechanism 40 moves upwardly and approaches the film guiding- and cutting-mechanism 10, the cutter 26 may swing and retreat, as shown in FIG. 4. For this purpose, the upwardly moving mechanism 40 is provided with a reflection beam sensor 31 (see FIG. 6) which detects a sensor plate 32 arranged at an outer side of the rail support bar 18, thereby allowing the cutter 26 to swing on the counter shaft 12. For this purpose, the clamp bar 2 at its upper face is fixed with a cylinder base plate 33, to which in turn is supported a swingable cylinder 35 through a cylinder trunion plate 34. The cylinder at its top end is linked to a joint arm 36 fixed to a side face of the gear box 13. When the swingable cylinder 35 is supplied with an air pressure, its cylinder rod allows the gear box 13 to swing on the counter shaft 12 through the joint arm 36 (in a clockwise direction in FIG. 4). Then, the timing rack 15 vertically passing through the swung gear box 13 may simultaneously swing, thereby enabling the cutter 26 at the lower end of the timing rack 15 to swing and retreat away from the printing-screen S.

As shown in FIG. 2, on the other hand, the pressing- and applying-mechanism 40 comprises a pressing member 53 for urging the emulsion screen film F against the screen on its contacted side, and an emulsion bucket 65 for supplying the emulsion D on the opposite side to moisten the emulsion membrane through a screen mesh, and vertically moves along the wall of the support frame 1. Each of the side walls of the frame 1 at its inner face is provided with a respective carriage base 41 to be lifted by a chain which is extended around the side wall. The carriage base 41 on its front side corresponding to a contacted side with the emulsion screen film F is provided with a roller 53 while the opposite side is provided with the emulsion bucket 65.

As shown in FIG. 7, both carriage bases 41 at their front and rear ends are connected through a carriage pipe 42 for ensuring their integrated vertical movement The carriage base 41 on its front side is fixed with a substantially horizontal slide rail 43 which is held between slide rollers 44 for arranging slide plates 45. The slide rail 43 at its end is associated with a front end of a retreatable cylinder 46 fixed to the slide plate 45. An air pressure applied on the retreatable cylinder 46 may move the cylinder rod, thereby moving the slide plate 45 horizontally (see FIG. 7).

Figure 6:
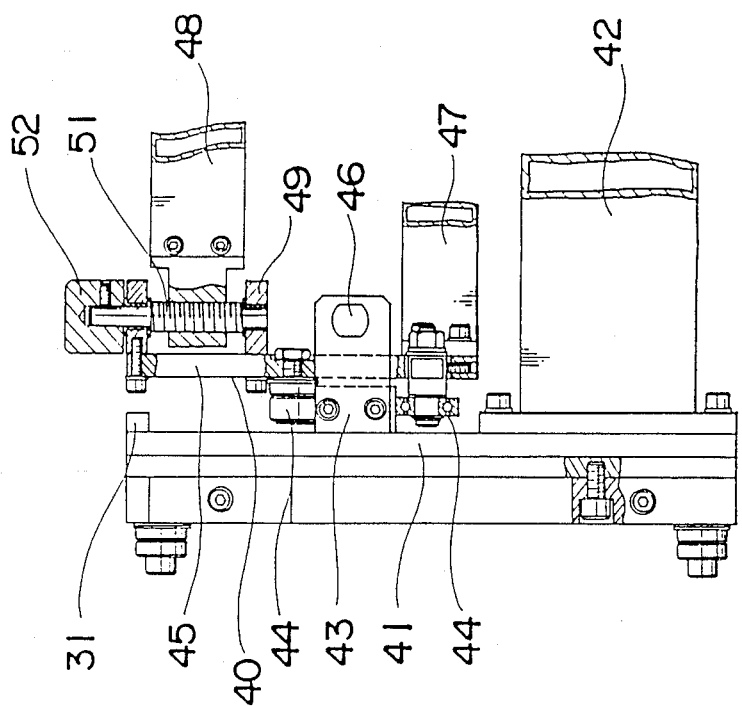

The right and left slide plates 45 are connected with each other through a slide plate pipe 47 for ensuring their integrated movement, while the slide plates are provided therebetween with a roller-mounting pipe 48 which, as shown in FIG. 6, is secured by fixing a pair of adjustable screw base 49 to an upper portion of the slide plate pipe 47 and threading the roller-mounting pipe 48 at one end to a roller-adjusting bolt 51 passing through the adjustable screw base 49. The turning operation of an adjusting knob 52 of the bolt 51 may vertically move the roller-mounting pipe 48 at its end. In this case, fine adjustment on both sides may determine a balanced level.

The roller-mounting pipe 48 is removably secured with a rolller 53 which on its circumference has been coated with a rubber lining for protecting the emulsion screen film F. As shown in FIG. 7, the roller 53 is rotatably supported between roller holders 54 of a U shape through a roller shaft 55 and fixed in a contacted position of the roller holder 54 with the rear side of the roller-mounting pipe 48 by a clamping screw device 56 which rides over the roller-mounting pipe 48.

The roller 53 holds the emulsion screen film F in association with the emulsion bucket 65 for urging the film F and the screen againt a pressure of the emulsion bucket. The roller of a rotatable type may reduce a friction against the lifting film F, thereby preventing damage of the latter. It will be appreciated that any other suitable pressing member, such as a bucket type or a blade structure, may be employed in stead of the roller 53.

Thus, an air pressure applied on the retreatable cylinder 46 enables the roller 53 to approach the printing-screen S for urging the emulsion screen film F against the screen and to move away from the printing-screen S for releasing the same. In this case, an urging pressure of the roller 53 onto the screen relative to the emulsion screen film F may be adjusted by the air pressure of the retreatable cylinder 46 and a spring 57 attached to a front end of the cylinder rod 46.

As shown in FIG. 7, the spring 57 may be arranged in a coil shape between a spring guide 62 of a cup shape and a tension plate 58. For this purpose, the tension plate 58 is fixed to one end of the slide rail 43 and is provided therethrough with a slide-adjusting bolt 59 which is connected securely to the front end of the cylinder rod 46, while the spring guide 62 is supported by a lock nut 61 which is retreatably threaded to the slide-adjusting bolt 59. The turning movement of the lock nut 61 may vary a distance between the spring guide 62 and the tension plate 58 for adjusting a deflection extent of spring 57, thereby adjusting the urging pressure of the roller 53 against the screen.

As shown in FIG. 7, the emulsion bucket 65 may move toward and away from the screen of the printing-screen S, and may be tilted to contact at its front edge with the screen for applying the emulsion D from the front edge. During the upward movement of the carriage base 41, the emulsion D may pass through the screen and moisten the emulsion membrane of the emulsion screen film F for applying the emulsion membrane onto the screen.

For this purpose, the carriage base 41 at its rear face is fixed with a substantially horizontal slide rail 66 which is held between slide rollers 67 which in turn arrange slide plates 68. The slide plate 68 is fixed with a top end of a retreatable cylinder 69, which end is associated with the end of the slide rail 66. Both slide plates 68 are connectd with each other through a slide plate pipe 71 for achieving their integrated movement Each of the slide plates 68 at its inner side is provided with a respective bucket pipe arm 72. Between the bucket pipe arms 72 is fixed a bucket pipe 73, to which a tilted cylinder 75 at its top end is connected through a joint arm 76. The tilted cylinder 75 is supported by a cylinder trunion plate 74 fixed to a side face of the slide plate pipe 71. Further, the bucket pipe arm 72 is removably provided with the emulsion bucket 65 which at its front edge is slidingly contacted with the screeen surface of the printing-screen S. An air pressure applied on the retreatable cylinder 69 may push the cylinder rod which in turn alllows the slide plate 68 to move toward the printing-screen S. Thereafter, an air pressure applied on the tilted cylinder 75 may push its cylinder rod which in turn allows the bucket pipe arm 72 to lift and swing, so that the emulsion bucket 65 at its front edge may be contacted with the screen surface and tilted to flow the emulsion D onto the screen.

Between the cylinder rod of the retreatable cylinder 69 and the end of the slide rail 66 is arranged a spring 77 similar to the spring 57. The variation in deflection extent of the spring 77 may adjust an urging pressure of the emulsion bucket against the screen.

One example for use of the apparatus will now be described. At first, the rolled emulsion screen film F is supported to the roll 4 at the upper portion of the frame 1, while the printing face is positioned and fixed vertically on the front side of the frame 1 by means of the supporting clamp 3 of the clamp bar 2 within the frame 1 (see FIGS. 1 and 2). In the film guiding- and cutting-mechanism 10 at the upper position of the printing-screen S, on the other hand, the timing rack 15 is vertically adjusted and locked at a height corresponding to a length of the emulsion screen film F to be applied onto the printing-screen S. The cutter guide plate 19 is then contacted to the printing-screen S while the cutter rail 24 is moved away from the cutter guide plate 19. During this period, a gap for passing the emulsion screen film F therethrough is set. In the pressing- and applying-mechanism 40 at the lower position of the printing-screen S, the roller 53 on the printing side of the printing-screen S and the emulsion bucket 65 on the opposite side thereto are moved away from the printing-screen S, while the emulsion bucket 65 is charged with a required amount of the emulsion D.

Thereafter, the emulsion screen film F on its emulsion membrane side is opposed to the printing side of the printing-screen S in the contacted state, while the emulsion screen film F is unrolled through the gap between the cutter rail 24 and the cutter guide plate 19 and guided down to the position of the pressing- and applying-mechanism 40. In the cutter 26 adjusted in its height corresponding to the required cutting length, the clamp cylinder 22 is supplied with an air pressure for pushing the cutter rail 24 forward, thereby holding the emulsion screen film F between the cutter rail 24 and the cutter guide plate 19. The cutter 26 is then guided by the cutter guide-on plate 21 and moved along the cutter rail 24 for cutting the emulsion screen film F (see FIG. 3).

Thereafter, the retreatable cylinders 46, 69 of the pressing- and applying-mechanism 40 are supplied with an air pressure for pushing the roller 53 forward to urge the emulsion screen film F against the screen surface, while the emulsion bucket 65 on the opposite side is also moved forward to hold the emulsion screen film F and the screen in association with the roller 53. Further, the tilted cylinder 75 is supplied with an air pressure for allowing the bucket pipe arm 72 supporting the emulsion bucket 65 and the bucket pipe 73 to swing, thereby tilting the emulsion bucket 65 on the screen side to flow the emulsion D out of the bucket (see FIG. 7). On this condition, the carriage bases 41 are driven upwardly for urging the emulsion screen film F against the screen, while on the opposite side the emulsion D is supplied through the screen to the emulsion membrane for its moistening and adhesion to the screen.

When the pressing- and applying-mechanism 40 has reached the film guiding- and cutting-mechanism 10, the reflection beam sensor 31 detects the sensor plate 32 and discontinues the lifting movement, thereby completing the applying procedure. Then, the swingable cylinder 35 of the film guiding- and cutting-mechanism 10 is supplied with an air pressure to swing the cutter 26 on the counter shaft 12 for moving away from the printing-screen S (see FIG. 4). On the other hand, an air pressure in the opposite direction is applied on the tilted cylinder 75 and the retreatable cylinder 69 for moving back the emulsion bucket 65 horizontally, while an air pressure also in the opposite direction is applied on the retreatable cylinder 46 for moving back the roller 53. Thus, the pressing- and applying-mechanism 40 moves downwardly to restore its initial position for waiting a next cycle.

The above procedures may be controlled automatically. Further, the pressing by the mechanism 40, the cutting of the film F after application, the swinging and retreating movement of the cutter 26 after the restored position of the mechanism 40, the number of times and the order of the applying and other procedures, as well as the conditions for the procedures may be optionally selected.

After the emulsion membrane of the emulsion screen film F has been applied on the screen, the film substrate is removed.

In accordance with the invention the rolled emulsion screen film F may be employed on the contrary to the conventional system in which the emulsion screen film must be cut in a required size prior to the applying step. Further, only the contact of the unrolled emulsion screen film F with the printing-screen S is necessary for all the steps, thereby improving the working efficiency. For example, the setting of the vertically supported printing-screen and the cutting in their required length may be readily and rapidly achieved.

In particular, the film guiding- and cutting-mechanism 10 enables the unrolled emulsion screen film F to be guided and contacted to the screen surface of the printing-screen S and to be cut in the required length, so that the contact of the emulsion screen film F with the screen surface may be smooth and that the cutting of the emulsion screen film F in the required length may be considerably convenient.

The pressing- and applying-mechanism 40 may urge the emulsion screen film F against the screen on the lower position of the printing-screen S and may move upwardly along the screen surface while supplying the emulsion to the opposite side of the contacted film F, so that the thickness of the membrane may be readily adjusted by the urging pressure and the number of application and that the required thickness of the membrane may be readily obtained.

What is claimed is:

1. An apparatus for applying an emulsion screen film of screen-printing, which comprises a support frame, means for vertically supporting on said frame a screen-printing plate with a screen surface and for holding a rolled emulsion screen film above the screen-printing plate, a swingable and vertically adjustable film guiding- and cutting-mechanism for vertically guiding and positioning the unrolled emulsion screen film in contact with said screen surface of the screen-printing plate from its upper portion and for cutting the film at a predetermined length, and a pressing-and applying-mechanism for pressing the emulsion screen film against the screen surface at its lower portion and for supplying an emulsion onto an opposite side of the screen surface relative to the contacted screen side while said pressing-and-applying-mechanism is sliding upwardly in contact with the screen surface.

2. The apparatus according to claim 1, wherein the film guiding- and cutting-mechanism is provided with counter shaft brackets on the left and right sides of the support frame for holding the unrolled emulsion screen film therebetween in contact with the screen-printing plate and cut the film.

3. The apparatus according to claim 1, wherein the film guiding- and cutting-mechanism has a counter shaft bracket on the left and the right side walls of the support frame provided with a counter shaft, said counter shaft bracket at its end having a gear box which vertically supports therethrough a timing rack in mesh with a pinion fixed to the counter shaft within the gear box, said timing rack at its lower end being fixed with a rail support bar, at a front end of which a cutter guide plate is arranged and positioned on a screen face of the screen printing plate, said rail support bar being fixed with a clamp cylinder having a cylinder rod, at a front end of which a cutter rail is arranged in parallel to the cutting guide plate, said cutter rail being provided with a movable cutter and fixed thereabove with a swingable cylinder having a cylinder rod, a front end of which is associated with the gear box, thereby enabling the swingable cylinder to swing and retreat the cutter.

4. The apparatus according to claim 1, wherein the pressing- and applying-mechanism comprises a pressing member for urging the emulsion screen film against the screen on its contacted side, and an emulsion bucket for supplying the emulsion on the opposite side to moisten the emulsion membrane through said screen, and means for moving said mechanism vertically along the wall of the support frame.

5. The apparatus according to claim 4, wherein the pressing member is arranged on the contacted side of the emulsion screen film and the screen printing plate supporting means comprises a carriage base which moves vertically along the wall of the support frame, and said pressing member is formed as a roller which is removably mounted to a roller-carriage pipe, said pipe being arranged between slide plates which are movable horizontally relative to the carriage base.

6. The apparatus according to claim 4 wherein the emulsion bucket is arranged on the opposite side to the contacted side of the emulsion screen film and the screen-printing plate supporting the wall of the support frame and swingably supports a pair of spaced bucket pipe arms horizontally movable relative to the carriage base, and said bucket is removably mounted to a bucket pie arranged between the bucket pipe arms.

7. The apparatus according to claim 5, wherein a slide plate in the pressing- and applying-mechanism is arranged by means of slide rollers to hold therebetween a slide rail fixed to the carriage base, said slide plate securing a retreatable cylinder which at its front end is associated with one end of the slide rail for pneumatically actuating the cylinder.

8. The apparatus according to claim 7, wherein a spring of variable deflection is arranged between the front end of the retreatable cylinder and the end of the slide rail.

9. The apparatus of claim 1 wherein the pressing- and applying-mechanism presses the emulsion screen film against the screen surface in a manner directly opposing the emulsion being supplied to the opposite side of the screen surface during the upward sliding movement of said mechanism.

10. The apparatus of claim 1 wherein the screen film has a predetermined thickness and is applied to said screen-printing plate by the emulsion being supplied to the opposite side of said screen-printing plate by said pressing- and applying-mechanism.

11. The apparatus of claim 1 wherein said guiding- and cutting-mechanism comprising swingable film guiding means constructed and arranged to move out of the path of said outwardly sliding pressing- and applying-mechanism.

* * * * *